(12) United States Patent
Dimitrov et al.

(10) Patent No.: US 8,803,519 B2
(45) Date of Patent: Aug. 12, 2014

(54) ENHANCED MAGNETIC SENSOR BIASING YOKE

(75) Inventors: Dimitar V. Dimitrov, Edina, MN (US); Dian Song, Eden Prairie, MN (US); Jason B. Gadbois, Shakopee, MN (US)

(73) Assignee: Seagate Technology LLC, Cupertino, CA (US)

( * ) Notice: Subject to any disclaimer, the term of this patent is extended or adjusted under 35 U.S.C. 154(b) by 376 days.

(21) Appl. No.: 13/194,782

(22) Filed: Jul. 29, 2011

(65) Prior Publication Data

US 2013/0027031 A1 Jan. 31, 2013

(51) Int. Cl.
*G01R 33/09* (2006.01)

(52) U.S. Cl.
USPC .......................................................... 324/252

(58) Field of Classification Search
USPC .......................................................... 324/252
See application file for complete search history.

(56) References Cited

U.S. PATENT DOCUMENTS

| 7,035,062 | B1 | 4/2006 | Mao et al. |
| 7,173,795 | B2 | 2/2007 | Garfunkel |
| 7,177,122 | B2 | 2/2007 | Hou et al. |
| 7,876,534 | B2 * | 1/2011 | Chou et al. ................... 360/319 |
| 2004/0071077 | A1 | 4/2004 | Aoishi |
| 2009/0257154 | A1 | 10/2009 | Carey et al. |
| 2010/0097729 | A1 | 4/2010 | Gill et al. |
| 2011/0007426 | A1 | 1/2011 | Qiu et al. |

* cited by examiner

*Primary Examiner* — Reena Aurora
(74) *Attorney, Agent, or Firm* — Hall Estill Attorneys at Law

(57) ABSTRACT

An apparatus and associated method are generally directed to a magnetic sensor. A sensor may have a stack with an air bearing surface (ABS) and a biasing surface opposite the ABS. A biasing yoke can be disposed between a biasing magnet and the stack with the biasing magnet having a lower magnet moment than the biasing yoke.

20 Claims, 9 Drawing Sheets

ENHANCED MAGNETIC SENSOR BIASING YOKE

SUMMARY

A sensor may have a stack with an air bearing surface (ABS) and a biasing surface opposite the ABS. A biasing yoke can be disposed between a biasing magnet and the stack with the biasing magnet having a lower magnet moment than the biasing yoke.

DETAILED DESCRIPTION

Figure 1:
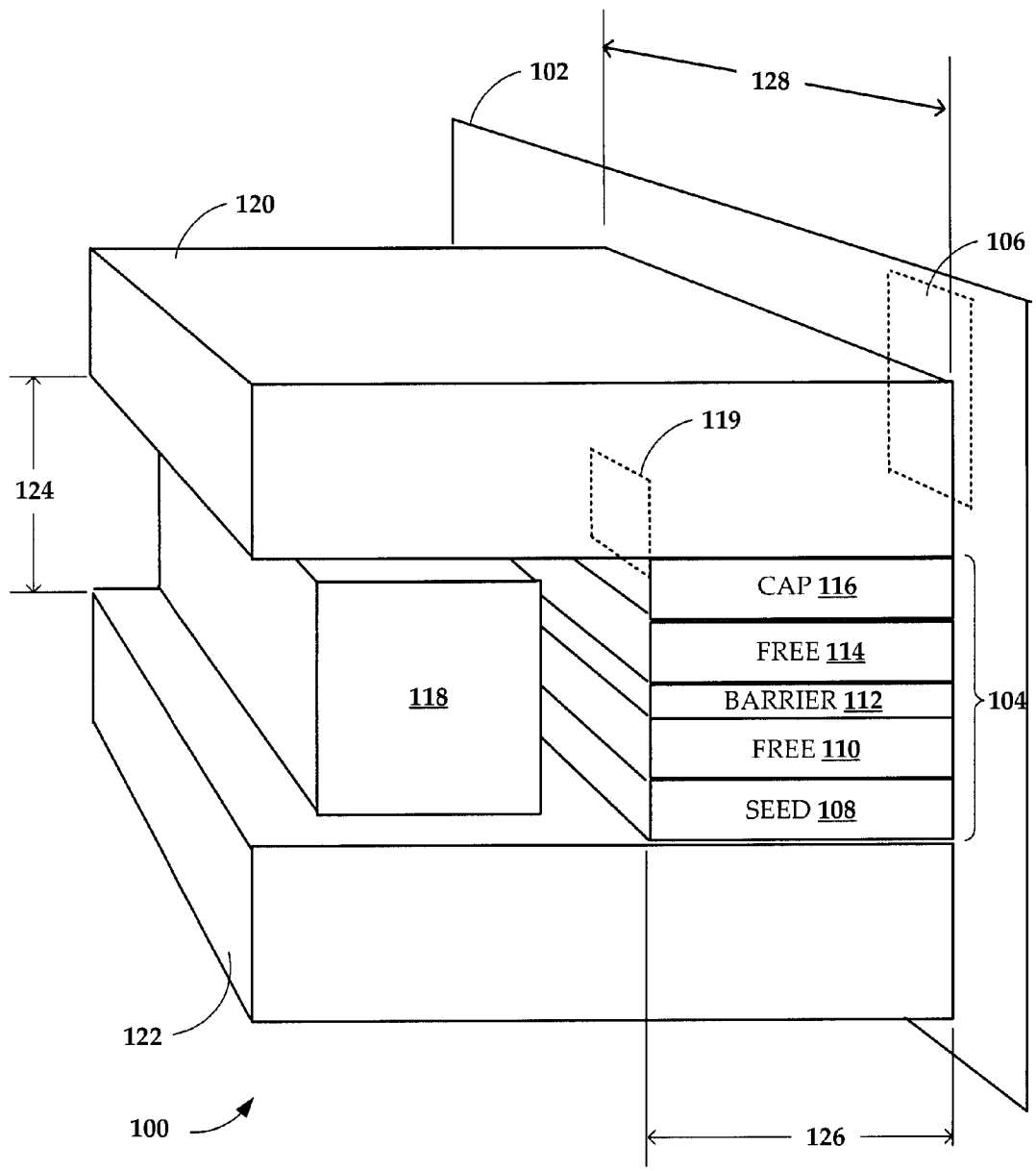
FIG. 1 is a perspective view of a trilayer reader according to an example embodiment.

The present disclosure relates generally to construction and operation of a magnetoresistive sensor stack, particularly biasing and stabilizing magnetic free layers of the sensor stack. With modern data storage devices advancing towards holding more data with increased data transfer rates, the size and accuracy of data transducing elements has become more scrutinized. As data transducing elements reduce in size, the use of a permanent magnet to bias a magnetic stack may decrease the shield-to-shield spacing while improving linear density of a data storage device. However, such use of a permanent magnet can be magnetically unstable and prone to inadvertently reverse magnetization directions, which can adversely affect measured resistance of the magnetic stack.

Accordingly, a biasing yoke can be placed between a biasing magnet and a magnetic stack. Placing the biasing yoke proximal to a biasing surface of the stack, opposite an air bearing surface (ABS) of the stack, allows for a permanent magnet to be placed farther away from the stack and impart magnetization through the yoke, which can reduce magnetic instability while providing tunable magnetic biasing of the stack.

Various constructions of the biasing yoke uses soft magnetic material that has a high magnetic moment to impart sufficient bias magnetization on the stack without inducing magnetic fluctuations. The use of soft magnetic material may be combined with one or more biasing features that maintain magnetic saturation of the biasing yoke and aid in providing consistent biasing to predetermined portions of the stack.

In a magnetic data storage and retrieval system, a magnetic recording head may include a reader portion having a magnetoresistive (MR) sensor for retrieving magnetically encoded information stored on a magnetic disc. Magnetic flux from the surface of the disc causes rotation of the magnetization vector of a sensing layer or layers of the MR sensor, which in turn causes a change in electrical resistivity of the MR sensor. The sensing layers are often called "free" layers, since the magnetization vectors of the sensing layers are free to rotate in response to external magnetic flux.

The change in resistivity of the MR sensor can be detected by passing a current through the MR sensor and measuring a voltage across the MR sensor. External circuitry then converts the voltage information into an appropriate format and manipulates that information as necessary to recover the information encoded on the disc.

Magnetoresistive sensors have been developed that can be characterized in three general categories: (1) anisotropic magnetoresistive (AMR) sensors, (2) giant magnetoresistive (GMR) sensors, including spin valve sensors and multilayer GMR sensors, and (3) tunneling magnetoresistive (TMR) sensors. AMR sensors generally have a single MR layer formed of a ferromagnetic material. The resistance of the MR layer varies as a function of the angle formed between the magnetization vector of the MR layer and the direction of the sense current flowing in the MR layer.

A GMR sensor has a series of alternating magnetic and nonmagnetic layers. The resistance of GMR sensors varies as a function of the spin-dependent transmission of the conduction electrons between the magnetic layers separated by the nonmagnetic layer and the accompanying spin-dependent scattering which takes place at the interface of the magnetic and nonmagnetic layers and within the magnetic layers. The resistance of a GMR sensor depends on the relative orientations of the magnetization in consecutive magnetic layers, and varies as the cosine of the angle between the magnetization vectors of consecutive magnetic layers.

A TMR sensor is configured similar to a GMR sensor, except that the magnetic layers of the sensor are separated by an insulating film thin enough to allow electron tunneling between the magnetic layers. The tunneling probability of an electron incident on the barrier from one magnetic layer depends on the character of the electron wave function and the spin of the electron relative to the magnetization direction in the other magnetic layer. As a consequence, the resistance of the TMR sensor depends on the relative orientations of the magnetization of the magnetic layers, exhibiting a minimum for a configuration in which the magnetizations of the magnetic layers are parallel and a maximum for a configuration in which the magnetizations of the magnetic layers are anti-parallel.

For these types of MR sensors, magnetization rotation occurs in response to magnetic flux from the disc. As the recording density of magnetic discs continues to increase, the width of the tracks on the disc may decrease, which necessitates smaller and smaller MR sensors as well. Many challenges exist as MR sensors become smaller in size, particularly for sensors with dimensions less than about 0.1 micrometer. In order for magnetic storage devices to continue the trend of ever increasing areal data storage densities, smaller sensors will be needed, and so these challenges will have to be overcome.

The present disclosure is directed to a type of magnetoresistive sensor design referred herein as a trilayer reader. A trilayer reader may include at least two free layers of ferromagnetic material separated by a magnetoresistive/spacer layer. A magnetic component may be used to bias the free layers, e.g., place the layers in magnetic alignment with each other to maximize sensitivity of the reader to changes in magnetic fields. As will be discussed in greater detail, there are circumstances in which a greater magnetic bias improves trilayer reader performance. However, reader stability and accuracy can be degraded by arbitrarily increasing the amount of magnetic bias imparted on a magnetic stack by a permanent magnet A number of configurations are described below than can help to overcome these limitations.

In reference now to FIG. 1, a perspective view illustrates components of a trilayer reader 100 according to an example embodiment. The reader 100 is generally disposed to read magnetic signals from a media 102, e.g., the surface of a hard drive disk. The reader 100 may be included in a hard drive reader/writer head (also referred to as a slider) that is placed in proximity to the media 102 for purposes of reading data from and writing data to the media 102.

The reader 100 includes a magnetoresistive stack 104. One edge of the stack 104 may be disposed on (or proximate to) an air bearing surface of the reader assembly 100, the air bearing surface being represented by plane 106 in FIG. 1. The air bearing surface 106 is held close to the media 102 when reading from and writing to the media. During reading operations, the stack 104 changes resistance in response to changing magnetic fields from the moving media 102. These changes in resistance generate a signal from which the recorded data may be determined. It will be appreciated that, while the present embodiments may be described in terms of hard drive readers, some concepts described herein may also be equally applicable other types of magnetic sensing devices, e.g., sensors used in magnetic random access memory (MRAM).

The illustrated stack 104 utilizes a trilayer design. As seen here, the trilayer stack 104 includes a seed layer 108, first free layer 110, tunneling barrier 112, second free layer 114, and cap layer 116. The stack 104 is flanked by top and bottom shields 120, 122. In order to achieve increase data storage density on the media 102, it may be possible to reduce the dimension 124 of the stack 104 between the shields 120, 122.

With a trilayer stack 104, is that it is possible reduce shield-to-shield spacing 124 with a trilayer design as compared to other stack configurations (e.g., TMR stack). A TMR stack, may use, for example, an anti-ferromagnetic pinning layer that is not required for the trilayer stack 104.

Another difference between some TMR readers and the illustrated reader 100 is the location of magnetic components (e.g., permanent magnets) that bias the free layers of the stack. Generally, biasing is used to cause relative magnetic alignments between the free layer and other components of the stack in order to optimize sensitivity of the stack to external magnetic fields. In some TMR arrangements, a permanent magnet is positioned along the sides of the stack (generally corresponding to surfaces of reader 100 parallel to the page in the view of FIG. 1). In contrast, the tri-layer stack 104 may utilize a magnetic component 118 positioned behind the stack 104, e.g., by a surface (represented here by plane 119) that faces away from the media 102.

Figure 2A:
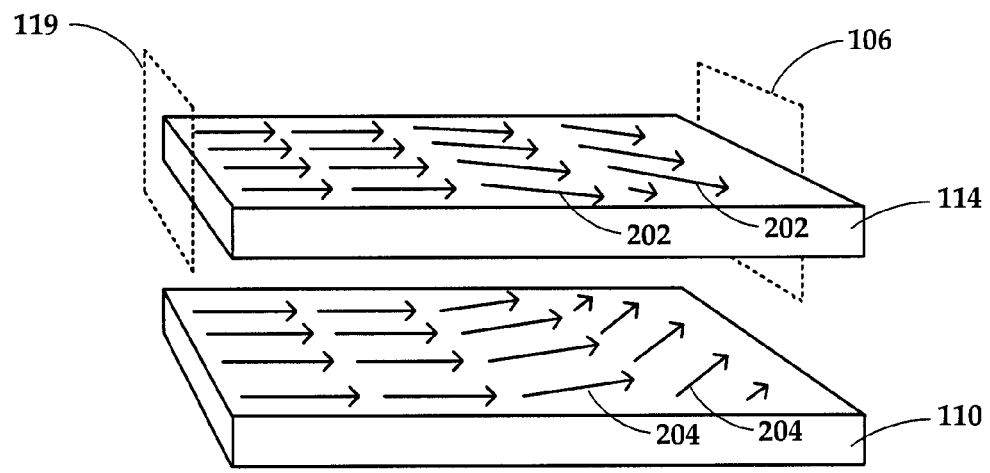
FIG. 2A is a perspective view of a magnetization distribution in free layers of a stack according to an example embodiment.
Figure 2B:
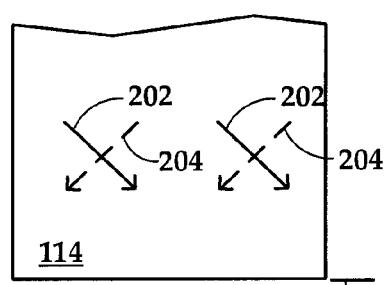
FIG. 2B is a top view of the free layers of FIG. 2A.

The magnetic component 118 aligns the magnetization direction of the free layers 110, 114 so that they are biased generally orthogonal to one another at least near the air bearing surface 106. This biasing is shown by way of example, in FIGS. 2A and 2B, which are simplified perspective and top views of the free layers 110, 114. In FIGS. 2A and 2B, arrows 202, 204 represent local magnetic field orientations within the layers 114, 110. As seen in FIG. 2B (which represents a top down view in an area of the free layers proximate the air bearing surface 106) optimal sensitivity may be obtained when vectors 202 and 204 are substantially orthogonal.

Unlike some MR designs where only a single free layer is influenced by the media's magnetic field, the fields 202, 204 of both layers 114, 110 are influenced by the media in a trilayer design. Because two free layers 114, 110 are influenced instead of just one, the trilayer design can be more sensitive in measuring magnetic fields. This sensitivity can further be improved by maintaining orthogonality between vectors 202, 204 at or near the sensing surface 106. This is because there will generally be a maximum rate of change of relative direction of the vectors 202, 204 in response to magnetic fields when the vectors 202, 204 are orthogonal. The substantially orthogonal, relative orientation of the magnetic fields vectors 202, 204 seen in FIGS. 2A and 2B may be referred to herein as the "working" state.

Figure 2C:
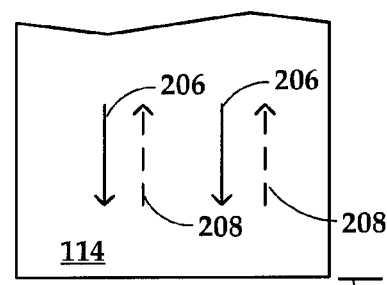
FIG. 2C is a top view of free layers of FIG. 2A with free layer magnetization distribution in anti-parallel alignment.

The magnetic component 118 provides a magnetic bias to maintain working state orientations of the free layers 110, 114 such as shown in FIGS. 2A-2B. The working state represents a local energy minimum, and thus is stable within some range of external stimuli. However, there is another stable state of the layers 110, 114, which is shown in FIG. 2C. This state is referred to as an "anti-parallel" state due to the opposite direction of parallel magnetic field vectors 206, 208 of layers 114, 110, respectively.

The anti-parallel state is stable, but because this state has high resistance and little output response, the state provides limited performance for magnetic sensors. It has been found that excitations such as heat and magnetic fields can cause the magnetic configuration to jump from the working state to a "dead" anti-parallel state. If the layers 114, 110 transition to and thereafter remain in the anti-parallel state when even when external influences are removed, then this may result in a hard failure of the reader 100.

In some designs the anti-parallel state may be energetically more favorable (e.g., with lower absolute energy) than the working state. In such a case, there is a risk of failure resulting from a reader reverting to and remaining in the anti-parallel state.

These failures may be induced due to manufacturing tolerances, and/or in response to extreme conditions during use. As a result, not only should the bias from the magnetic component 118 be sufficient to maintain the working state, but the bias (as well as other characteristics of the stack 104) may also be selected to ensure that the free layers be prevented from jumping to and settling in the anti-parallel state.

While the theoretical modeling of the trilayer stack design predicts good performance, in practice it has been found to be sensitive to variations in manufacturing processes, e.g., resulting in low manufacturing yields. It has been determined that increasing the stripe height of the stack 104 (e.g., dimension 126 in FIG. 1) helps overcome this sensitivity to manufacturing tolerances, and thereby results in acceptable yields using current manufacturing processes. For example, dimension 126 of the stack 104 may be at least 4 times larger than the shield-to-shield spacing 124, 128 of the stack.

Although a longer stripe height 126 improves manufacturability of the reader, it presents other challenges related to the magnetic component 118. In order to stably maintain the predetermined magnetic orientation seen in FIGS. 2A and 2B, the magnetic component 118 may need features that provide sufficient field strength to bias the free layers 110, 114 to remain in the working state. For example, increasing the stripe height 126 of the stack 104 may also require similarly increasing magnetic moment of a rear-located magnetic biasing component 118.

In shorter stripe height designs, a permanent magnet may provide sufficient field strength to bias the free layers. However, the strength of a permanent magnet cannot arbitrarily be increased to account for stacks with stripe heights that exceed certain values. Among the permanent magnet materials commonly used in these applications, the FePt series has the highest moment (about 1.2 Tesla). In contrast, soft magnetic materials (e.g., CoFe series) may have a much larger moment (e.g., 2.4 Tesla). Therefore, forming the magnetic component 118 out of a soft magnetic material may provide sufficient bias for a trilayer stack 104 with long stripe height.

Soft magnetic materials have low coercivity. Generally, this means that soft magnetic materials require relatively lower applied magnetic fields to reduce magnetization to zero after being saturated as compared to high coercivity (hard magnetic) materials. Thus the fields in soft magnetic materials are susceptible to become desaturated in response to external stimuli. Therefore, additional measures may need to be taken to ensure that a soft magnetic component 118 remains saturated so as to provide sufficient magnetic bias on an elongated trilayer stack.

In the following example embodiments, the magnetic component 118 may be variously described as a soft magnet, soft magnetic yoke, etc. Even so, it should be appreciated that the magnetic component 118 may include multiple constituent parts, not all of which need be made of soft magnetic materials. For example, one embodiment illustrated in FIG. 3A, includes a soft magnetic biasing yoke 302 positioned behind the trilayer stack 104, with a permanent biasing magnet 304 located behind the biasing yoke 302.

Figure 3A:
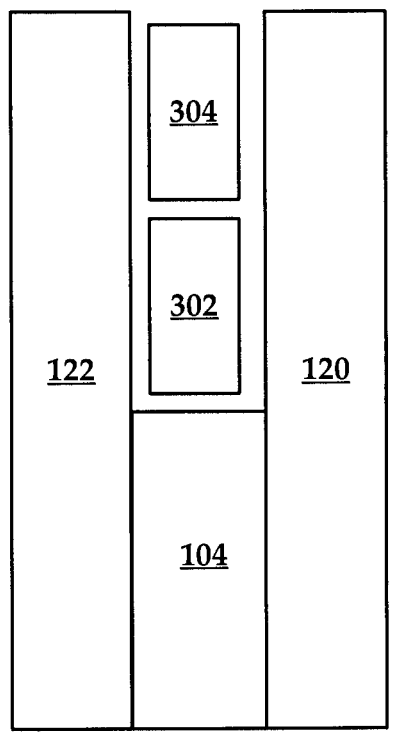
FIG. 3A is an end view of a trilayer stack reader with a soft magnetic yoke and permanent magnet according to an example embodiment.
Figure 3B:
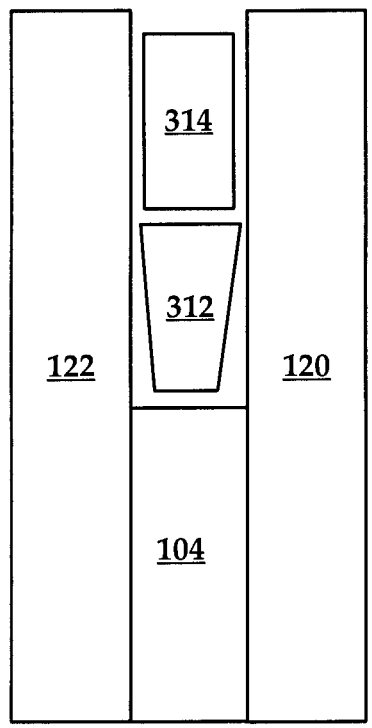
FIGS. 3B and 3C are respective end and top views of a trilayer stack reader with a beveled soft magnetic yoke and permanent magnet according to an example embodiment.

In the arrangement of FIG. 3A, shape anisotropy may be used in order to maintain magnetic saturation of the biasing yoke 302. The permanent biasing magnet 304 may further assist in stably maintaining the yoke's magnetic field by ensuring that the magnetic fields of the biasing yoke 302 maintain correct alignment. In another embodiment seen in FIG. 3B, a biasing yoke 312 may use one or more beveled edges to maintain saturation. These edges may be on one projection of the biasing yoke 312 as seen in FIG. 3B, and or may include bevels where the biasing yoke 312 is projected onto planes normal to the page. This is shown by way of example, in FIG. 3C, which is a top view of the stack arrangement of FIG. 3B.

Figure 4A:
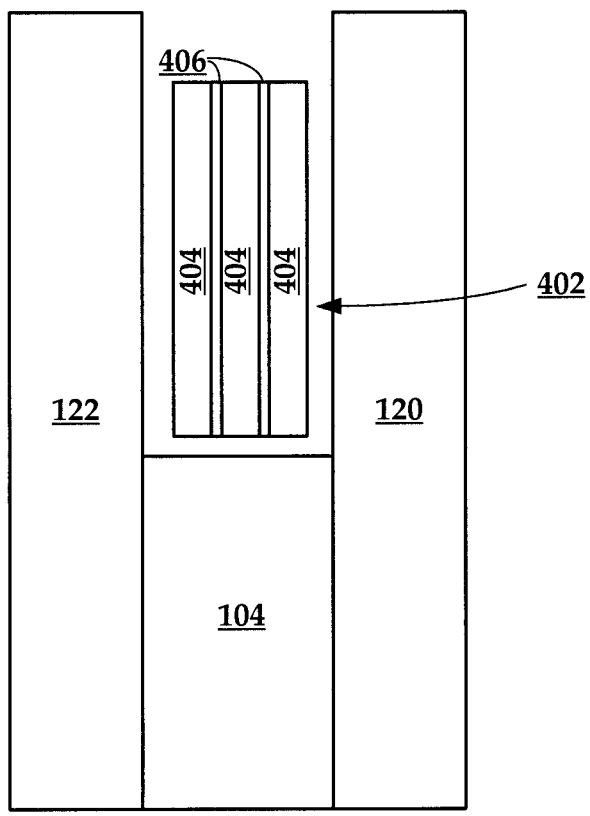
FIG. 4A is an end view of a trilayer stack reader with a laminated magnetic biasing component according to an example embodiment.
Figure 4B:
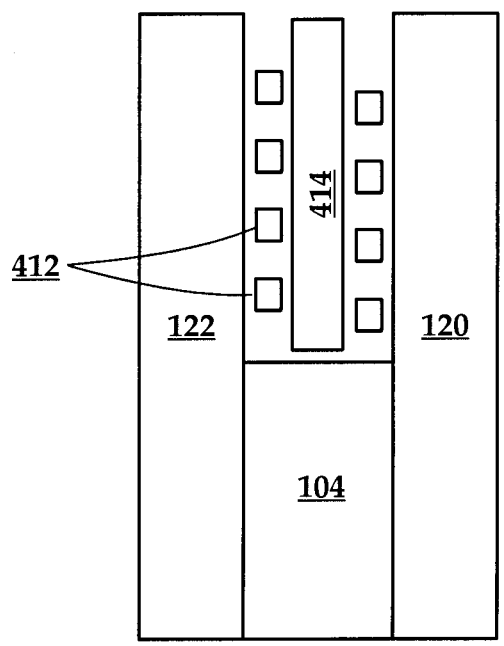
FIG. 4B is an end view of a trilayer stack reader with a coil surrounding a magnetic yoke according to an example embodiment.

In reference now to FIGS. 4A and 4B, additional embodiments of a magnetic biasing yoke for a trilayer stack 104 are shown. In FIG. 4A, a biasing yoke 402 includes soft magnetic material layers 404 laminated with layers 406 of non-magnetic and/or ferromagnetic material. These additional layers 406 may help ensure the soft magnetic layers 404 obtain full or near saturation. In FIG. 4B, a coil 412 is shown wrapped around a soft magnetic core 414. A current may be run through the coil 412 to generate a magnetic field and thereby ensure full or near saturation of the core 414.

Figure 5A:
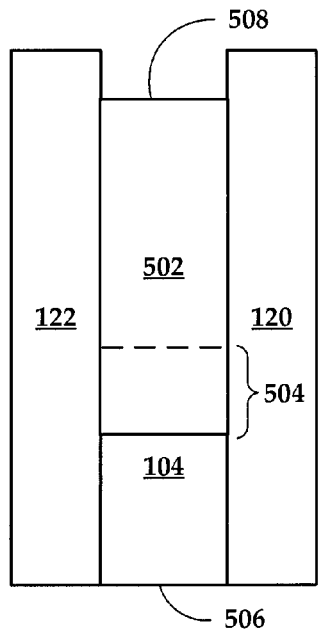
FIGS. 5A and 5B are respective end and top views of a trilayer stack reader with an overhanging magnetic yoke according to an example embodiment.
Figure 5B:
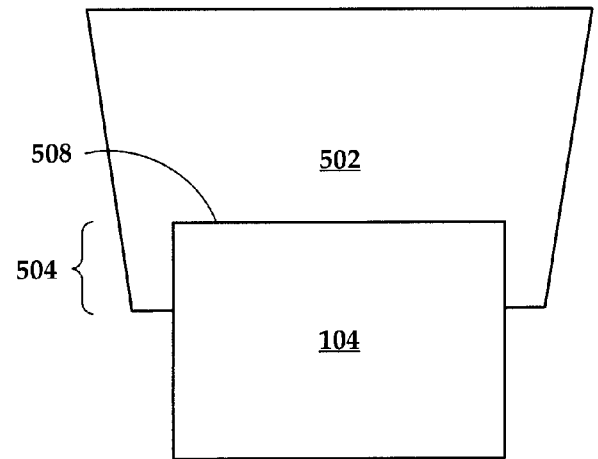
Figure 5C:
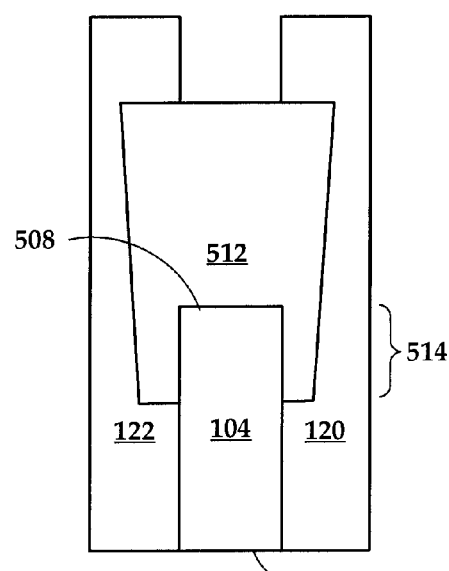
FIG. 5C is an end view of a trilayer stack reader with an overhanging magnetic yoke according to another example embodiment.

Generally, the previous embodiments can increase bias at least at an end of the stack 104 proximate the magnetic biasing yoke. It may be possible, in some embodiments, to bring more bias to a middle portion of the stack 104. In FIGS. 5A-5C, example embodiments for increasing bias further down the length of a trilayer stack 104, e.g., closer to an air bearing surface of a slider. In FIGS. 5A-B, respective side and top views of a magnetic biasing component 502 are shown according to an example embodiment. The magnetic biasing component 502 may be formed, in whole or part, from hard or soft magnetic materials.

The biasing component 502 includes an overhang portion 504 that surrounds the sides of the stack 104 with multiple orthogonal surfaces. The overhang portion 504 may include any portion of the biasing component 502 that extends between an edge 506 of the stack 104 proximate a media reading surface (e.g., proximate an air bearing surface) and the opposite edge 508. The edges of the component 502 may also be beveled, e.g., as shown and described relative to the embodiments shown in FIGS. 3B-C. A similar beveled arrangement is seen with component 512 in FIG. 5C, except that overhang portion 514 extends over top and bottom edges of stack 104. It should be apparent that a magnetic biasing component may include a combination of features from FIGS. 5A-C. Similarly, the components 502, 504 may include other previously disclosed features, such as lamination of soft magnetic material with non-magnetic and/or ferromagnetic materials, electrical coils, and/or separate permanent magnets.

Figure 3C:
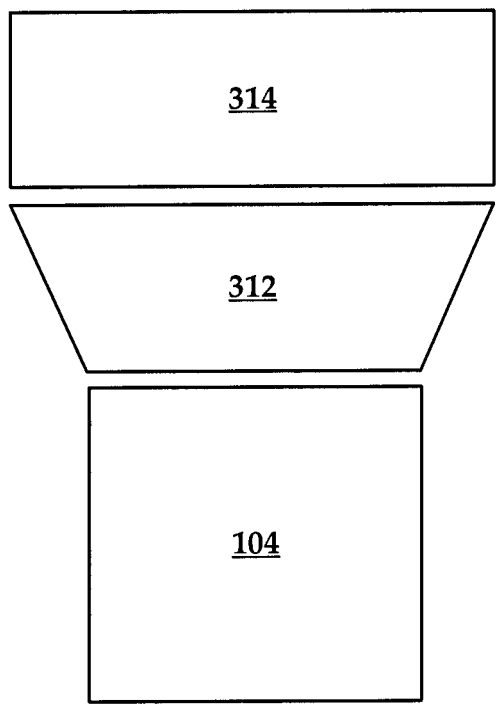
Figure 6A:
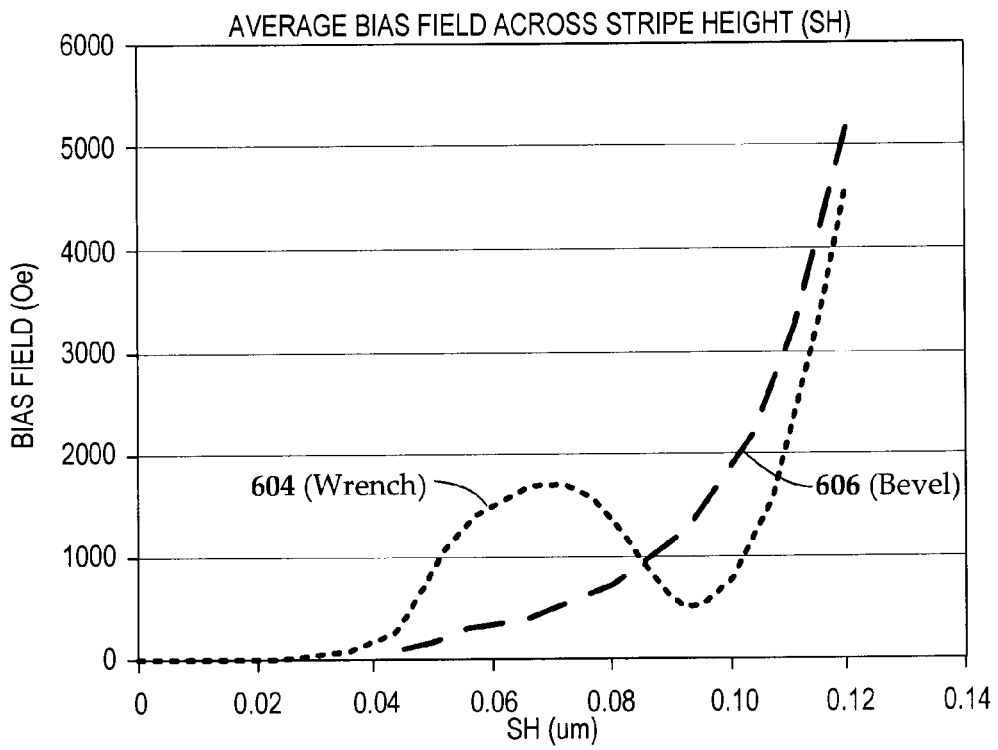
FIGS. 6A-6B are graphs illustrating predicted bias field strength across stripe height of a free layer according to another example embodiment.
Figure 6B:
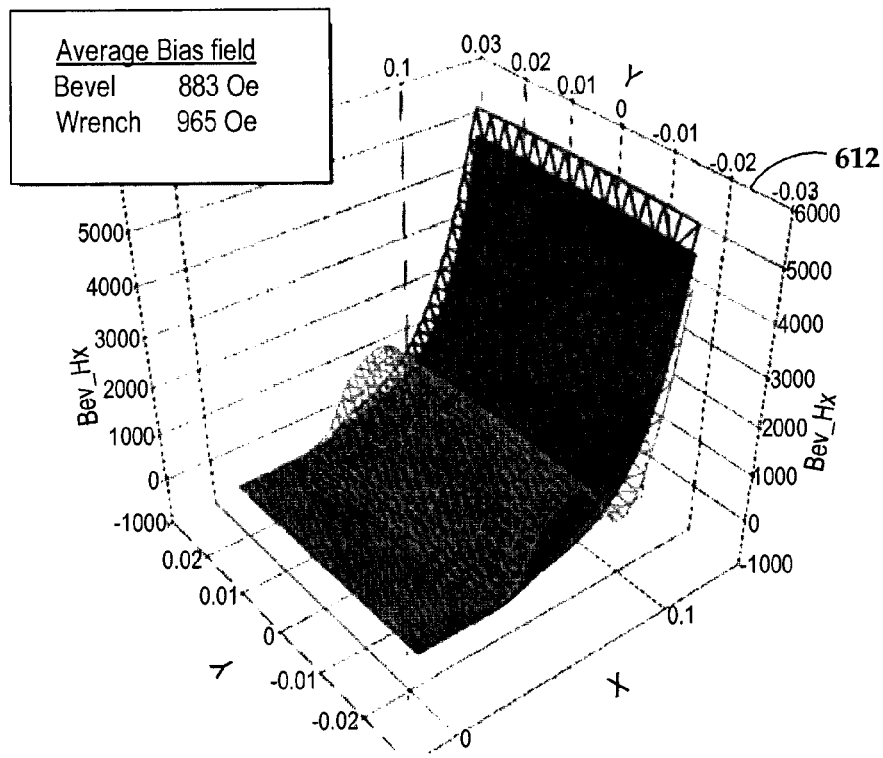

In reference now to FIGS. 6A and 6B, graphs 602, 612 illustrate numerical modeling results of magnetic biasing components according to two example embodiments. In graph 602, curve 604 represents the bias field strength versus stripe height for an overhang type design such as shown in FIGS. 5A-5C. Curve 606 represents a similar result for a beveled design such as shown in FIGS. 3B-3C. Graph 612 shows the results in a three-dimensional view across the width of the reader stack.

In these graphs 602, 612, the size of the stack is approximately 0.12 μm high by 0.04 μm wide. The location where stripe height equals zero, e.g., the horizontal axis in FIG. 6A, corresponds to the air bearing surface of a slider (or media reading edge of a similar reading device). In both of these curves 604, 606, the fields exhibit the predetermined behavior of the field strength at or approaching zero at the air bearing surface. The beveled curve 606 exhibits a smooth decline, while the "wrench" curve 604 exhibits a peak near the middle of the stack, which may be favorable under certain conditions.

Figure 7:
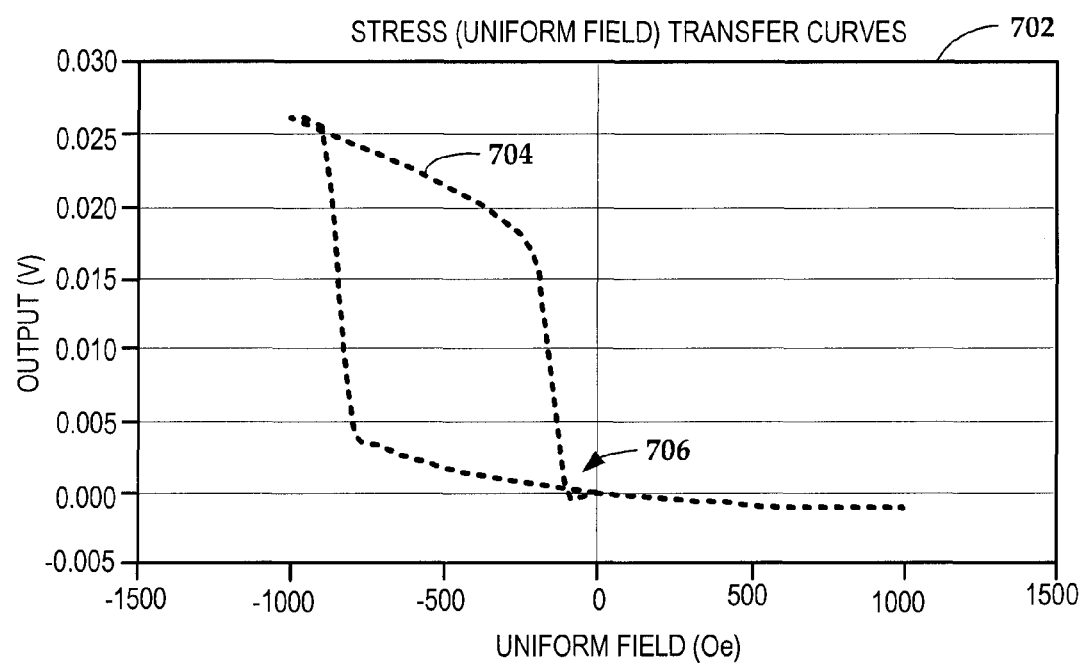
FIG. 7 is a graph illustrating a predicted transfer curve for one of the example embodiments.

In reference now to FIG. 7, a graph 702 illustrates numerically derived transfer curve performance 704 of a trilayer stack reader that is biased by an overhang-type magnetic biasing component design such as shown in FIGS. 5A-5C. The curve shows the output of the trilayer stack element under influence of external negative and positive magnetic fields. Of interest in this curve 704 is the performance of the curve on the left side of the graph, where a strong negative external magnetic field is applied. When the field is approximately −800 Oe, the output of the stack is exhibits behavior consistent with an anti-parallel alignment of the free layers (e.g., high resistance, reflected by high voltage across the stack). As the negative field is decreased subsequently, the reader restabilizes as seen in portion 706. So long as the output returns to this state before reaching the zero field axis, the reader should remain operable even after being exposed to this magnitude of negative magnetic field.

Figure 8:
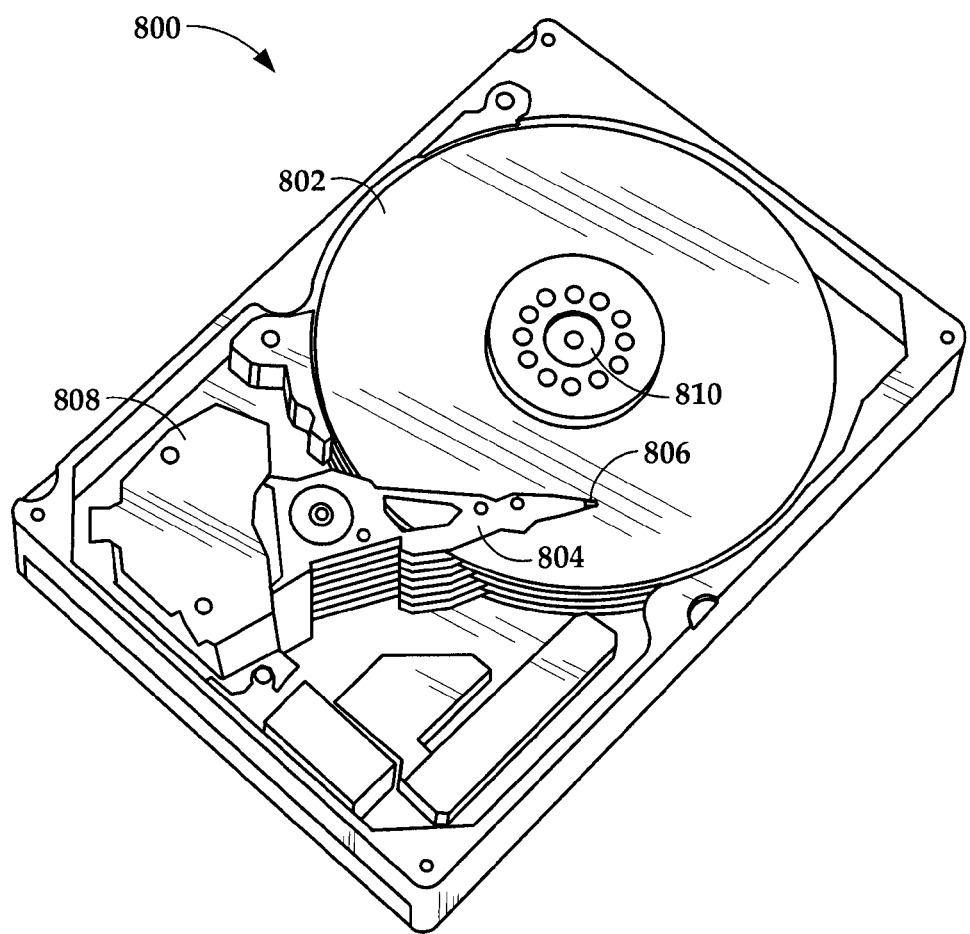
FIG. 8 is a perspective view of a hard drive apparatus according to an example embodiment.

The techniques and structures described herein may be used, for example, in read/write heads of a magnetic data storage device such as hard drive apparatus 800 shown in FIG. 8. The apparatus 800 generally includes at least one magnetic disk 802 that rotates around a spindle axis 810. The apparatus 800 further includes an arm 804 with an end-mounted a transducer head 806 that is positioned over a surface of the disk while reading from or writing to the disk 802. The arm 804 is driven by an actuator 808 to move radially across the disk 802. This movement of the arm 804 positions the transducer head 806 over on the disk 802 to read from or write to tracks on the disk 802. A hard drive of this type may include multiple arms 804 and disks 806 arranged in a stack formation, and may include read/write heads that read/write from/to both surfaces of the disks 802.

The transducer head 806 (also referred to as a "slider") may include both magnetic read and write heads. A read head generally operates by detecting a changing magnetic field, e.g., changes in direction of magnetic flux caused by relative motion between an encoded magnetic media and the read head. The read head includes a element (e.g., a trilayer, magnetoresistive stack) that converts the flux reversals into an electrical analog signal that represents data stored on the media. The write head operates in response to a current sent through a conductor surrounding a write pole, which generates a magnetic field at a tip of the write pole. This magnetic field in turns changes the orientation of a local magnetic field local at the surface of the disk 802, causing data to be persistently stored on the disk 802.

Figure 9:
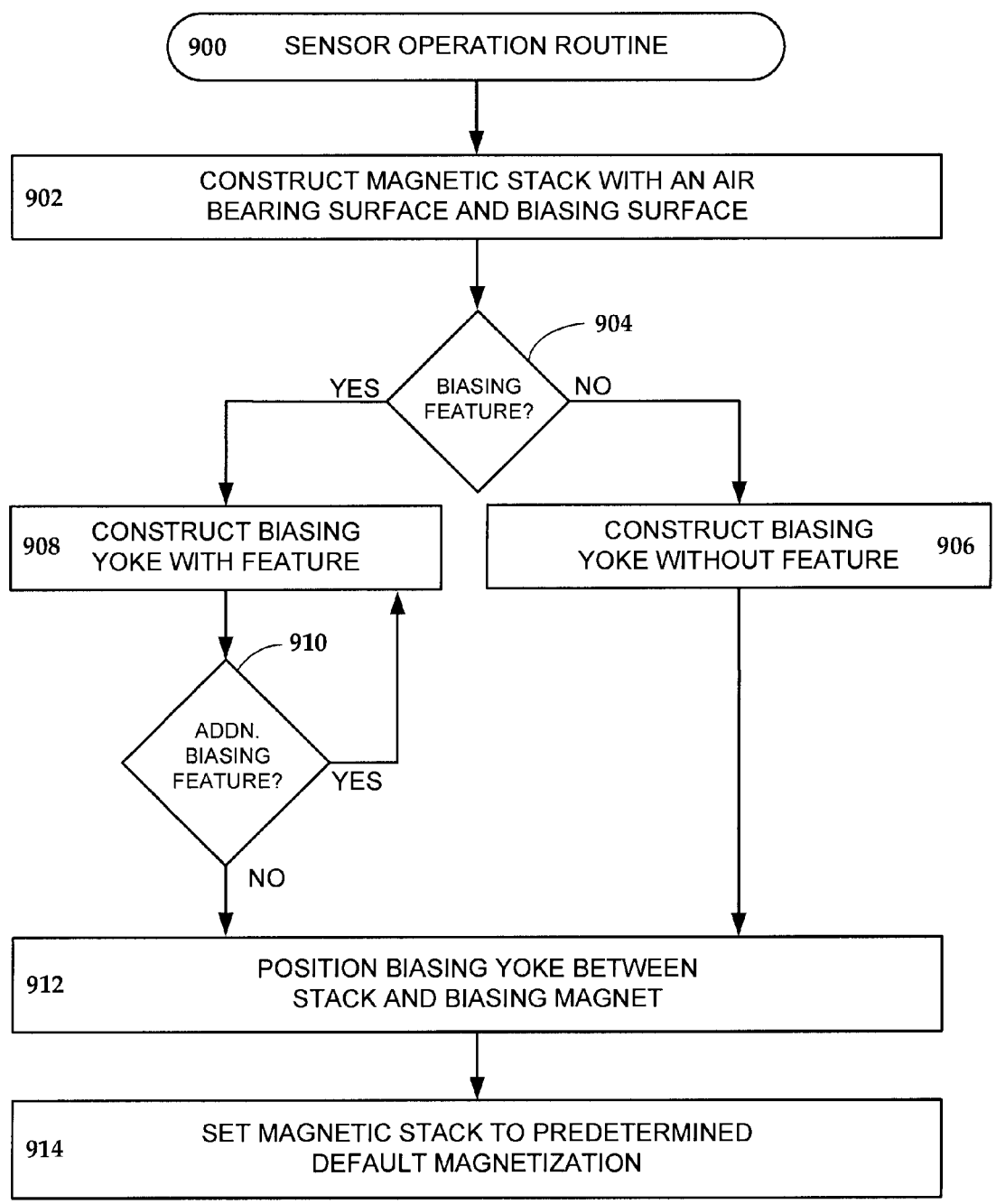
FIG. 9 provides an example flowchart of a sensor operation routine conducted in accordance with various embodiments of the present invention.

FIG. 9 provides an example flowchart of a sensor operation routine 900 conducted in accordance with various embodiments of the present invention. Initially, the routine 900 constructs a magnetic stack in step 902 with an air bearing surface and a biasing surface. As discussed above, the air bearing surface (ABS) can face a data media while the biasing surface is opposite and facing away from the ABS. Construction of the magnetic stack is not limited to a particular type of magnetic sensor or a certain number of sensing layers, but in some embodiments, a trilayer stack is used having two magnetic free layers without a magnetic pinning layer that can add to the shield-to-shield spacing of the stack.

With the magnet stack constructed, decision 904 evaluates if a biasing feature is to be incorporated into a biasing yoke. Decision 904 reviews the various biasing feature embodiments discussed in relation to FIGS. 3A-5C and chooses to construct a non-featured yoke in step 906 or utilize a biasing feature in the construction of step 908. The use of single biasing feature is not required or limited as decision 910 subsequently allows for more than one feature to be constructed in the biasing yoke. It is to be understood that steps 908 and 910 can occur successively, as shown, or simultaneously in the various embodiments of the routine 900.

Regardless of the presence of biasing features, steps 906 and 908 can further correspond to positioning in step 912 between the magnetic stack and a permanent magnet. Such positioning can provide enhanced magnetic stability in the magnetic stack as the permanent magnet induces a default magnetization in the stack in step 914 through magnetic saturation of the high magnetic moment and soft magnet biasing yoke. While not required, step 912 can position the biasing yoke in predetermined positions to allow the biasing features to focus magnetization on a predetermined portion of the magnetic stack, which can allow the biasing yoke to precisely set certain portions, such as a middle portion, to a default magnetization.

It can be appreciated that a wide variety of sensors can be constructed and operated from the routine 900 with various structural and operational characteristics, such as magnetic saturation and induced default magnetization. The routine 900, however, is not limited only to the steps and decisions provided in FIG. 9 as any number of steps and determinations can be added, omitted, and modified to accommodate the fabrication and operation of a precisely tuned magnetic sensor It should be noted that the configuration and material characteristics of the magnetic sensor described in the present disclosure allows for enhanced data reading performance while maintaining a reduced form factor, which provides wide applicability in high capacity data storage devices. The use of a biasing yoke in combination with the permanent magnet provides accurate biasing of the magnetic stack without inducing undue magnetic volatility. Moreover, the utilization of one or more biasing features allows for tuning of the biasing yoke to reliably maintain magnetic saturation and consistent magnetic stack biasing. In addition, while the embodiments have been directed to magnetic sensing, it will be appreciated that the claimed invention can readily be utilized in any number of other applications, including data storage device applications.

It is to be understood that even though numerous characteristics and configurations of various embodiments of the present invention have been set forth in the foregoing description, together with details of the structure and function of various embodiments of the invention, this detailed description is illustrative only, and changes may be made in detail, especially in matters of structure and arrangements of parts within the principles of the present invention to the full extent indicated by the broad general meaning of the terms in which the appended claims are expressed. For example, the particular elements may vary depending on the particular application without departing from the spirit and scope of the present invention.

What is claimed is:

1. A magnetoresistive sensor, comprising:
   a stack with an air bearing surface (ABS); and
   a biasing yoke disposed between and aligned with a biasing magnet and the stack along an axis perpendicular to the ABS, the biasing yoke positioned to be saturated by the biasing magnet and bias the stack with a default magnetization, the biasing magnet having a lower magnet moment than the biasing yoke.

2. The magnetoresistive sensor of claim 1, wherein the biasing yoke is a soft magnetic material that utilizes shape anisotropy to stabilize magnetization of the biasing yoke.

3. The magnetoresistive sensor of claim 1, wherein the stack has first and second free layers separated by a tunneling junction.

4. The magnetoresistive sensor of claim 1, wherein the biasing yoke comprises at least one beveled surface proximate the biasing surface.

5. The magnetoresistive sensor of claim 1, wherein the biasing yoke is disposed between the stack and biasing magnet.

6. The magnetoresistive sensor of claim 1, wherein the biasing yoke comprises a lamination of soft magnetic material with one or more of non-magnetic layers and ferromagnetic layers.

7. The magnetoresistive sensor of claim 1, wherein a stack height in the direction normal the ABS is at least four times larger than a shield-to-shield spacing of the stack.

8. The magnetoresistive sensor of claim 1, wherein the biasing yoke is configured to influence the stack to maintain orthogonal magnetic orientations proximate the ABS.

9. A sensor, comprising:
   a stack with an air bearing surface (ABS); and
   a first biasing element disposed between and aligned with the stack and a second biasing element along an axis perpendicular to the ABS, the first biasing element positioned to be saturated be the second biasing element and bias the stack with a default magnetization, the first biasing element having a stack feature that maintains the first biasing element in a magnetically saturated state.

10. The sensor of claim 9, wherein the stack feature is a notch and the stack is positioned with a first biasing element surface facing the stack and parallel to the ABS and a second biasing element surface facing the stack and orthogonal to the ABS.

11. The sensor of claim 9, wherein the stack feature is a coil that increases the magnetization of the first biasing element.

12. The sensor of claim 9, wherein the stack feature is a beveled surface that reduces a width of the first biasing element proximal the stack.

13. The sensor of claim 9, wherein the stack feature is a lamination of non-magnetic and ferromagnetic layers.

14. The sensor of claim 9, wherein the stack feature is an overhang portion that extends past a biasing surface of the stack towards the ABS.

15. The sensor of claim 14, wherein the stack feature surrounds the biasing surface with a plurality of orthogonal surfaces.

16. A method comprising:
constructing a stack with an air bearing surface (ABS); and
positioning a biasing yoke between a biasing magnet and the stack along an axis perpendicular to the ABS, the biasing yoke positioned to be saturated by the biasing magnet and bias the stack with a default magnetization, the biasing magnet having a lower magnet moment than the biasing yoke.

17. The method of claim 16, wherein the default magnetization aligns a first magnetization of a first free layer of the stack orthogonal to a second magnetization of a second free layer of the stack.

18. The method of claim 17, wherein the first and second magnetizations are present proximal the ABS, the first and second magnetizations differing from first and second local magnetizations of the respective first and second free layers.

19. The apparatus of claim 16, wherein the biasing magnet saturates the biasing yoke prior to biasing the stack.

20. The apparatus of claim 16, wherein the biasing yoke has a biasing feature that focuses magnetic flux on a predetermined portion of a biasing surface of the stack that is less than an overall length of the biasing surface.

* * * * *